United States Patent
Chou

(10) Patent No.: US 8,238,166 B2
(45) Date of Patent: Aug. 7, 2012

(54) METHODS OF PROGRAMMING AND READING SINGLE-LEVEL TRAPPED-CHARGE MEMORY CELLS USING SECOND-BIT THRESHOLD DETECTION

(75) Inventor: Tsung Yi Chou, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 344 days.

(21) Appl. No.: 12/577,687

(22) Filed: Oct. 12, 2009

(65) Prior Publication Data
US 2011/0085386 A1   Apr. 14, 2011

(51) Int. Cl.
   *G11C 11/34* (2006.01)
(52) U.S. Cl. .......... 365/185.24; 365/185.18; 365/189.07
(58) Field of Classification Search ............. 365/185.24, 365/185.18, 189.07, 185.22, 185.13, 185.25, 365/163, 148, 230.03, 185.03
See application file for complete search history.

(56) References Cited

U.S. PATENT DOCUMENTS

| 5,943,260 | A | 8/1999 | Hirakawa | |
|---|---|---|---|---|
| 6,426,892 | B2 | 7/2002 | Shibata et al. | |
| 6,643,188 | B2 | 11/2003 | Tanaka et al. | |
| 7,447,067 | B2 | 11/2008 | Kong et al. | |
| 2008/0253188 | A1* | 10/2008 | Aritome | 365/185.17 |
| 2008/0285343 | A1* | 11/2008 | Park et al. | 365/185.03 |
| 2009/0233727 | A1* | 9/2009 | Tuck et al. | 473/257 |

FOREIGN PATENT DOCUMENTS

TW    200816206    4/2008

* cited by examiner

*Primary Examiner* — Dang Nguyen
(74) *Attorney, Agent, or Firm* — Stout, Uxa, Buyan & Mullins, LLP

(57) ABSTRACT

Methods are disclosed to compensate for a second-bit effect during programming and reading of charge-trapping memory cells having left and right data regions. When only one of the left and right data regions is to be programmed, a two-step programming procedure is performed on the data region to be programmed. When the memory cell is to be read, threshold voltages for the left and right data regions are sensed with a joint decision regarding left and right data bit values being reached depending upon both sensed threshold voltage values.

10 Claims, 9 Drawing Sheets

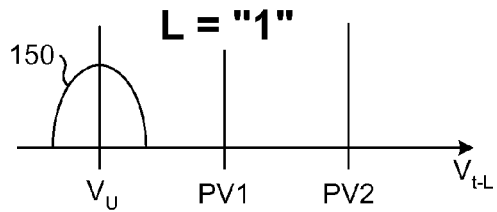
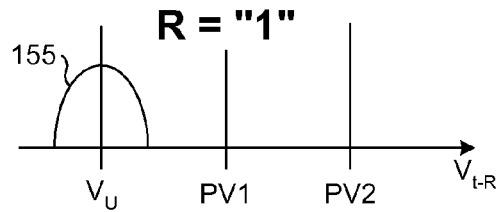
FIG. 2A  FIG. 2B
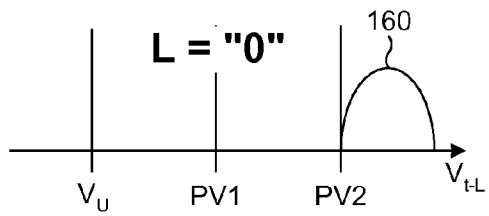
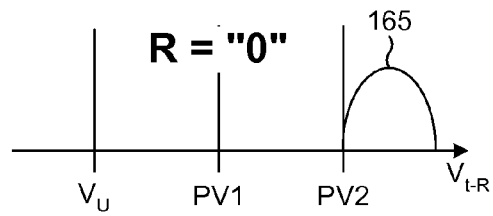
FIG. 3A  FIG. 3B
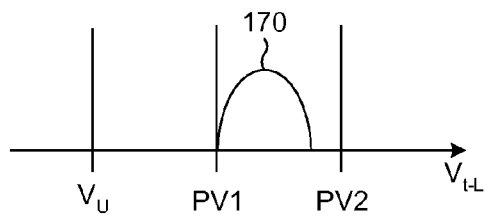
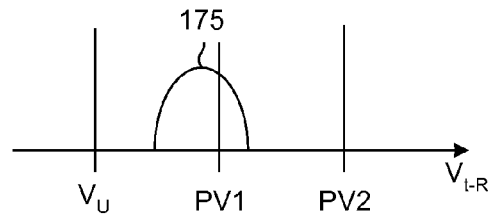
FIG. 4A  FIG. 4B
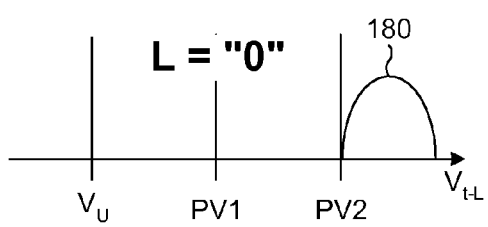
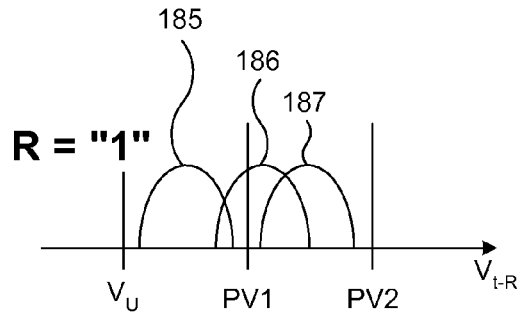
FIG. 4C  FIG. 4D

METHODS OF PROGRAMMING AND READING SINGLE-LEVEL TRAPPED-CHARGE MEMORY CELLS USING SECOND-BIT THRESHOLD DETECTION

BACKGROUND OF THE INVENTION

1. Field of the Invention

The present invention relates generally to semiconductor memories and, more particularly, to operation of memory cells.

2. Description of Related Art

Non-volatile semiconductor memory devices are designed to maintain programmed information even in the absence of electrical power. Non-volatile memories in common use today include read-only memories (ROMs) that typically are programmed to store a fixed bit pattern at the time of manufacture and that cannot be reprogrammed subsequently. Programmable read-only memories (PROMs) are a form of field-programmable memory devices that can be programmed once by a PROM programmer. Erasable programmable read-only memories (EPROMs) are programmable like PROMs, but can also be erased, for example, by exposure to ultraviolet light that places all bits in the memory to a known state (e.g., a logic 1). Electrically erasable programmable read-only memories (EEPROMs) are similar to EPROMs except that individual stored bits can be erased electrically. A particular form of EEPROMs, known as flash memories, typically is erased in blocks, although flash memory cells can be programmed individually.

Charge-trapping memory devices represent a relatively recent development in non-volatile memory technology. A charge-trapping memory cell normally is programmed by applying programming voltages to terminals of the device, which injects charge into a charge-trapping layer of the memory cell and modifies a threshold voltage ($V_t$) of the cell. The cell can be read by applying a reading voltage to the terminals of the device and detecting a level of current in a drain circuit, thereby inferring a value for the $V_t$ of the cell. When the $V_t$ is programmable to a value in one of two distinguishable ranges, then the cell is able to store a bit of information in a single transistor. Typically, the cell can assume one of two states: programmed and unprogrammed. An unprogrammed cell can have a $V_t$ near about 2 V, while the $V_t$ of a programmed cell might range from about 3 V to about 5 V, as an example. A cell that supports two distinguishable levels of $V_t$ is referred to as a single-level cell (SLC).

Certain types of SLCs store a bit in each of two (i.e., left and right) localized regions of the charge-trapping layer, whereby $V_t$ is modified separately in each of the two localized regions for a total of two (i.e., left and right) bits per transistor. Known methods of programming and reading SLCs are described in, for example, U.S. Pat. No. 6,011,725, which is incorporated herein in its entirety by reference.

Unfortunately, a degree of coupling, which has been referred to as a second-bit effect, almost inevitably exists between the left and right localized regions in a charge-trapping SLC. This coupling, which can raise the $V_t$ of an unprogrammed region when the other region in the same cell is programmed, reduces a programming window associated with the cell. That is, the coupling effect can require that the $V_t$ of a programmed region be increased to compensate for the coupling. The larger required $V_t$ can lead to one or more of a larger supply voltage, a larger second-bit effect and other undesirable conditions that can reduce efficiency of operation of the cell. Prior-art approaches, seeking to rectify the second-bit effect by decoupling the charge distribution of the left bit from the charge distribution of the right bit, have met with only limited or qualified success.

A need thus exists in the prior art for a method of operating trapped-charge memory cells capable of mitigating the undesirable second-bit effect.

SUMMARY OF THE INVENTION

The present invention addresses these needs by providing a method of operating a single-level memory cell. An implementation of the method herein disclosed comprises providing (e.g., receiving) first and second bits of data (to be programmed into the cell) with each bit having one of a first and a second value, programming a first data region of the cell according to the value of the first bit, and programming a second data region of the cell according to the value of the second bit.

When the first and second bits (to be programmed) have the first value, the first and second data regions can be programmed by changing their threshold voltages to a second level.

When the first and second bits (to be programmed) have the first value and second values, respectively, the first data region can be programmed by changing its threshold voltage to a first level. Subsequently, the threshold voltage of the second data region may be sensed. When the sensed threshold voltage of the second data region is greater than the first level, the threshold voltage of the first region may change to the second level using a method of soft programming.

The present invention further provides a method of reading a memory cell having first and second data regions. An implementation of the method comprises sensing a threshold voltage of the first data region and comparing the sensed threshold voltage with first and second threshold levels. When the sensed threshold voltage is greater than the second threshold level, a decision is made that the first data region is programmed. When the sensed threshold voltage is less than the first threshold level, then a decision is made that the first data region is unprogrammed. Another implementation of the method further comprises sensing a threshold voltage of the second data region when the threshold voltage of the first data region is not less than the first threshold level and not greater than the second threshold level. When the threshold voltage of the second data region is less than the first threshold level, a decision is made that the first data region is programmed. When the threshold voltage of the second data region is greater than the second threshold level, then a decision is made that the first data region is unprogrammed.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIGS. 2A and 2B are charts illustrating threshold voltage distributions of left respective and right data regions of an unprogrammed charge-trapping SLC;

FIGS. 3A and 3B are charts showing distributions of threshold voltage of respective left and right data regions of a charge-trapping SLC having both data regions programmed;

FIGS. 4A-4F are charts depicting distributions of threshold voltages for left and right data regions after steps of a procedure for programming only the left data region of a charge-trapping SLC;

DETAILED DESCRIPTION OF THE PRESENTLY PREFERRED EMBODIMENTS

Figure 1:
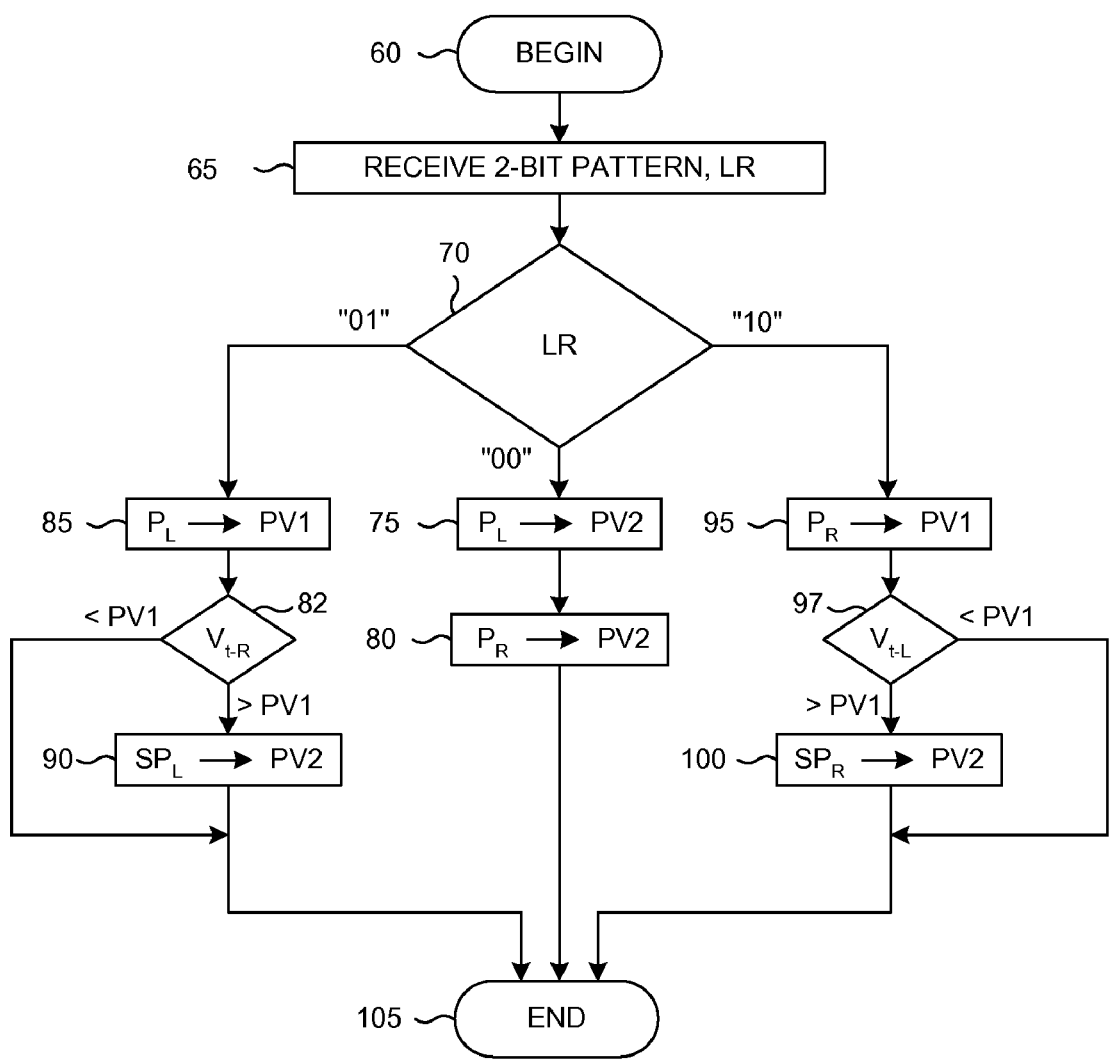
FIG. 1 is a flow diagram of an implementation of a method of programming a charge-trapping single-level cell (SLC) having left and right data regions.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps described herein do not cover a complete process flow for the operation of the disclosed devices. The present invention may be practiced in conjunction with various integrated circuit memory structures and with other techniques that are conventionally used in the art, and only so much of the commonly practiced process steps are included herein as are necessary to provide an understanding of the present invention. The present invention has applicability in the field of semiconductor memories in general. For illustrative purposes, however, the following description pertains to a charge-trapping memory device and a related method.

Referring more particularly to the drawings, FIGS. 2A and 2B are charts illustrating threshold voltage distributions of left and right data regions of an unprogrammed memory cell, which may be a charge-trapping single-level memory cell (SLC). It is a common practice to consider each data region of a charge-trapping SLC to assume one of two states: programmed or unprogrammed (i.e., erased). An unprogrammed data region may be said to have a data bit of value "1" stored therein, and a programmed data region may be said to have stored therein a data bit of value "0." An unprogrammed data region may have associated therewith a distribution 150 of a threshold voltage ($V_t$) nominally distributed around an unprogrammed threshold voltage level, $V_U$, as illustrated for a left data region in FIG. 2A, where the threshold voltage for the left data region is denoted by $V_{t-L}$. For a typical NMOS SLC, $V_U$ may be about 2 V. A similar threshold voltage distribution 155 for the right data region, denoted by $V_{t-R}$, is illustrated in FIG. 2B when the right data region is unprogrammed. A charge-trapping SLC having the depicted left and right $V_t$ distributions 150 and 155 is considered to have a 2-bit pattern "11" stored therein. Since programming an erased charge-trapping SLC to a value of "11" requires no action, the following relates primarily to the programming of such a cell to "00," "01" and "10" values.

The flow diagram of FIG. 1 shows an implementation of the method, which may begin at step 60 and continue at step 65 by providing, e.g., receiving, a pair of bits (LR) specifying a value to be programmed into left and right data regions of a memory cell. The memory cell may comprise, for example, a charge-trapping SLC. The value of LR may be, for instance, one of a "10," a "00" or a "01" value. As used herein, the pair of bits is denoted by LR, where L denotes a left bit and R denotes a right bit of a 2-bit pattern. At step 70, one of three programming options may be selected, according to the value of LR.

When LR is "00" at step 70, the left bit is programmed to a level of PV2 at step 75, and the right bit is likewise programmed to the PV2 level at step 80. One interpretation of programming to a level of PV2 is illustrated in FIGS. 3A and 3B for the left and right data regions, respectively. In FIG. 3A, a distribution 160 of $V_t$ for the left data region, denoted by $V_{t-L}$, is shown having about all, or a predetermined amount of values greater than a programming level PV2. As is the case for the left data region, the right data region is similarly programmed to the PV2 level as illustrated by a distribution 165 for $V_{t-R}$ in FIG. 3B. One method of choosing a level for PV2 is to set PV2 at a level higher than a threshold level associated with all "1" data, including second-bit "1" data.

Figure 4E:
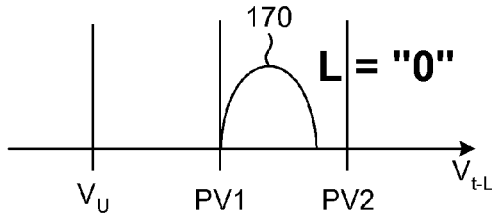

When LR is "01" at step 70, programming of the left data region is a conditional action. At step 85, the left data region is first programmed to a level of PV1. One possible result of this first programming step (step 85) is elucidated in FIG. 4A, which illustrates a distribution 170 of values of $V_{t-L}$ having about all or a predetermined amount of values greater than PV1. With reference to FIG. 4B, as an undesirable situation, a distribution 175 of $V_{t-R}$ comprising values greater than the $V_U$ level also may be generated. This undesirable distribution 175 of $V_{t-R}$ values, caused by and during programming of the left data region, and which can be attributed to a second-bit effect, may or may not include values of $V_{t-R}$ that are greater than PV1. FIG. 4B illustrates a case where the distribution 175 includes values of $V_{t-R}$ that are greater than PV1. The case where the distribution 175 does not include values of $V_{t-R}$ that are greater than PV1 is considered below with reference to FIGS. 4E and 4F.

After programming the left data region to a level of PV1 at step 85, a test is performed at step 82 to measure (i.e., sense) the threshold voltage $V_{t-R}$ of the right data region. If $V_{t-R}$ is greater than PV1 (cf., e.g., FIG. 4B), programming of the left data region continues at step 90 by performing a soft program of the left data region to a level of $V_{t-L}$>PV2.

"Soft programming," as referred to herein, describes a programming procedure that is slower and more accurate than, what may be referred to as, "normal programming." For example, in soft programming, a threshold voltage may be increased by using a relatively large number of small programming increments, each followed by a test of threshold voltage to determine whether another small programming increment should be applied. In contrast, normal programming may employ a relatively small number of large programming increments followed by threshold voltage tests. Normal programming may be used, for example, to program an SLC to "00", as the second-bit effect cannot disturb distributions of $V_{t-L}$ and $V_{t-R}$ that are both greater than PV2. Soft programming, on the other hand, may provide greater precision in accounting for the second-bit effect when "01" or "10" data are to be programmed into an SLC.

After the soft programming step (step 90), functional $V_t$ distributions may be obtained as are illustrated in FIGS. 4C and FIG. 4D for the left and right data regions, respectively. The $V_{t-L}$ distribution 180 can have about all or a predetermined amount of $V_t$ values greater than PV2, which is consistent with a data value of "0" being stored in the left data region. Because of the second-bit effect, programming of the left data region may produce one of a range of $V_{t-R}$ distributions, e.g., 185, 186 or 187, comprising values less than PV2 and which may or may not be greater than PV1.

Figure 4F:
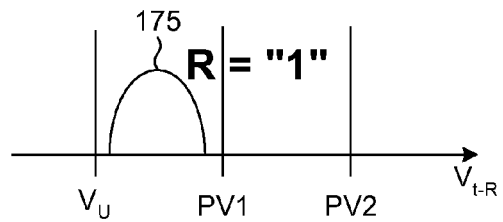

If, at step 82, $V_{t-R}$ is less than PV1, then programming of the left data region may be halted, and the implementation may terminate at step 105 resulting in $V_{t-L}$ and $V_{t-R}$ distributions, examples of which are illustrated in FIGS. 4E and 4F. It may be noted in FIGS. 4E and 4F that the distribution 170 of $V_{t-L}$ values is greater than PV1 while the distribution of $V_{t-R}$ values is less than PV1.

According to a feature of the present invention, charge distributions (e.g., 175 in FIG. 4B) affected by the second-bit effect are accepted (e.g., allowed to occur), rather than stifled as may occur with the prior art. According to the present invention, the second-bit effect on charge distributions is subsequently compensated for, when writing data into and reading data from a memory cell (e.g., a charge-trapping SLC).

Figure 5A:
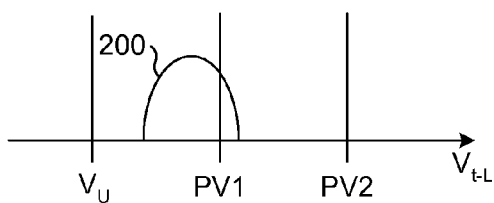
FIGS. 5A-5F are charts illustrating threshold voltage distributions for left and right data regions of a charge-trapping SLC after steps of a procedure for programming only the right data region.
Figure 5B:
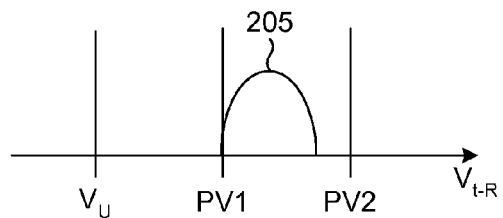
Figure 5C:
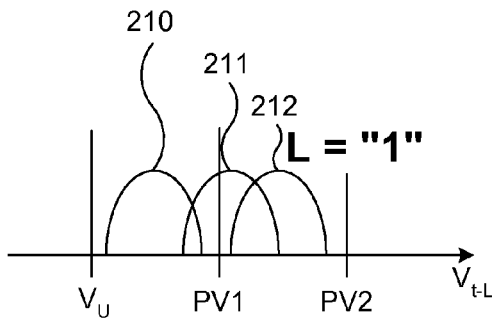
Figure 5D:
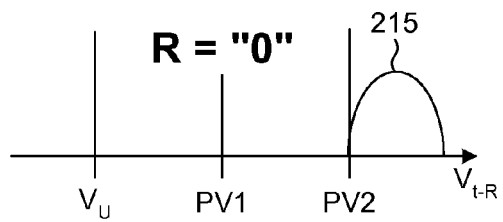
Figure 5E:
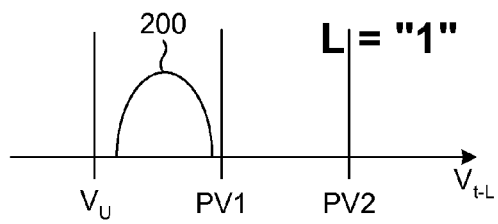
Figure 5F:
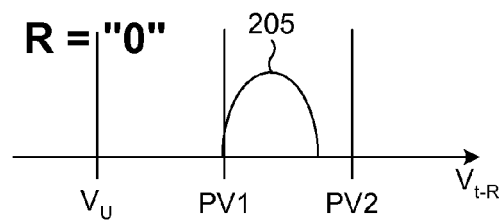

When LR is "10" at step 70, a similar, but complementary, programming procedure is followed relative to the LR="01" situation. That is, at step 95, the right data region is programmed to a level of PV1, yielding a distribution 205 (FIG. 5B) of $V_{t-R}$ values about all or a predetermined amount of which are greater than PV1. As a byproduct, a distribution 200 (FIG. 5A) of $V_{t-L}$ may result that may be changed from its unprogrammed position due to the second-bit effect. At step 97 a test of $V_{t-L}$ is performed. If $V_{t-L}$ is greater than PV1, then the right data region is soft programmed to a level of PV2, which may produce a distribution 215 (FIG. 5D) for $V_{t-R}$ having about all, or a predetermined amount of values greater than PV2. One of a range of distributions 210, 211 or 212 (FIG. 5C), for example, for $V_{t-L}$ may contain values less than PV2 and which may or may not be greater than PV1. The distribution for $V_{t-L}$ is a consequence of the second-bit effect occurring when the right data region is programmed to a level of PV2. If, at step 97, $V_{t-L}$ is less than PV1, then the programming of the right data region may be halted, yielding distributions for $V_{t-L}$ and $V_{t-R}$ that may appear as illustrated in FIGS. 5E and 5F. The implementation may terminate at step 105 following either step 80, step 82, step 90, step 97 or step 100.

It should be noted that FIGS. 2A-5F and the methods described herein pertain to operation of, for example, NMOS memory devices. Modifications of this description to pertain to operation of memory devices that employ, for example, PMOS technology will be apparent to one skilled in the art in view of this disclosure. In particular, $V_U$, PV1, and PV2 may be related as PV2<PV1<$V_U$ for PMOS devices.

Reading data from a charge-trapping SLC is normally performed by known methods that involve sensing a $V_t$ level for each of the left and right data regions of the charge-trapping SLC. Normal methods may not apply, however, to charge-trapping SLCs programmed according to the implementation described above with reference to FIG. 1 because the implementation does not attempt to stifle the second-bit effect. Rather, implementations of methods as outlined in the flow diagrams of FIGS. 6A, 6B and 7 may be employed when reading charge-trapping SLCs so programmed.

The description that follows applies to the reading of a charge-trapping SLC that has been programmed according to the implementation described above with reference to FIG. 1. In particular, FIG. 6A describes an implementation of a method of reading a left bit, FIG. 6B pertains to reading a right bit, and FIG. 7 combines the implementations of FIGS. 6A and 6B in order to read both the left and right bits of a charge-trapping SLC.

Figure 6A:
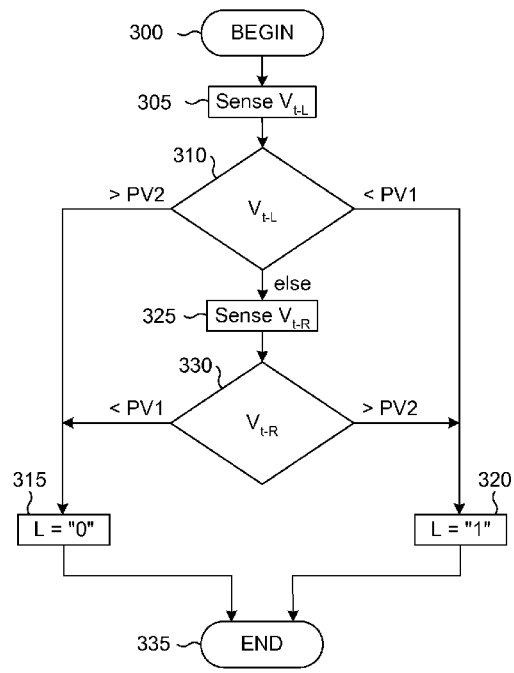
FIG. 6A is a flow diagram of an implementation of a method of reading a left data region of a charge-trapping SLC.

The implementation summarized in FIG. 6A commences with step 300 and continues at step 305 by sensing a value of a threshold voltage $V_{t-L}$ of the left data region of the cell, such as, but not limited to, a charge-trapping SLC. A result of the sensing is tested at step 310. Interpretation of the testing relative to the left data region may be better understood with reference to FIGS. 2A, 3A, 4C, 4E, 5C, 5E. At step 310, if $V_{t-L}$>PV2, then the implementation continues at step 315 by setting the left bit to "0." Reference to FIGS. 3A and 4C confirms that the left data region of the cell, indeed, is programmed (i.e., left bit="0") when $V_{t-L}$>PV2. Conversely, at step 310, when $V_{t-L}$<PV1, the implementation continues to step 320 where the left bit is set to "1." This decision is reasonable, considering that FIGS. 2A and 5E verify that $V_{t-L}$<PV1 for an unprogrammed left data region. Furthermore, all or portions of the distributions 210 and 211 in FIG. 5C have values less than the PV1 level when the left bit is "1," which is consistent with an L="1" decision at step 320.

Returning again to step 310, if PV1<$V_{t-L}$<PV2, then knowledge of $V_{t-L}$ does not provide enough information to make a decision about the state of the left bit. That is, PV1<$V_{t-L}$<PV2 may describe a situation illustrated in FIG. 4E where L="0" or FIG. 5C where L="1." Accordingly, the threshold level of $V_{t-R}$ is sensed at step 325, and a test of the sensed threshold level is performed at step 330. If $V_{t-R}$>PV2 at step 330, then a decision is made at step 320 that L="1." This decision is consistent with, for example, FIGS. 5C and 5D where the right data region is programmed to a level of PV2 (cf. $V_{t-R}$ distribution 215) and $V_{t-L}$ distributions 211 and 212, although influenced by the second-bit effect, contain values less than PV2.

After the decisions regarding the left bit are completed at either step 315 or 320, the implementation of the method may terminate at step 335.

Figure 6B:
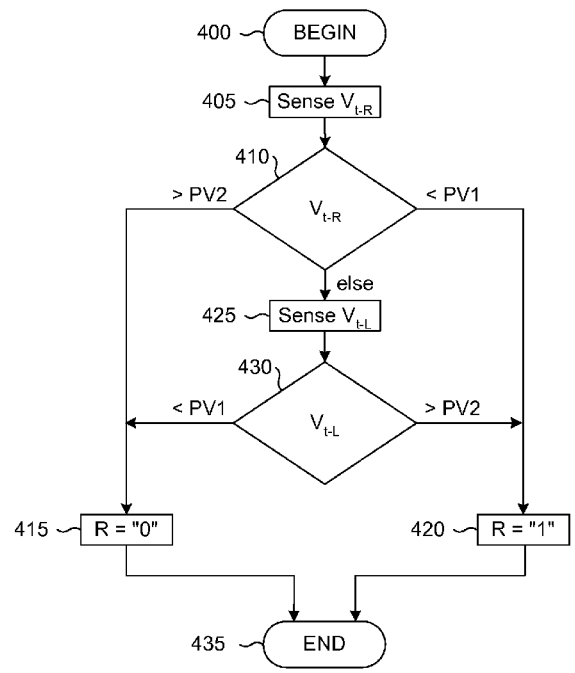
FIG. 6B is a flow diagram of an implementation of a method of reading a right data region of a charge-trapping SLC.

FIG. 6B is a flow diagram describing an implementation of a method of reading a right data region of a memory cell, such as, but not limited to, a charge-trapping SLC, according to the present invention. It may be noted that the implementation described in FIG. 6B is complementary to the implementation described in FIG. 6A with roles of the left and right data regions reversed. The implementation begins at step 400, followed by a threshold voltage $V_{t-R}$ being sensed at step 405. At step 410, a three-way decision regarding $V_{t-R}$ is made with the right bit R being set to "0" at step 415 if $V_{t-R}$ is greater than PV2. If $V_{t-R}$ is less than PV1, then the right bit R is set to "1" at step 420. If, at step 410, PV1<$V_{t-R}$<PV2, then $V_{t-L}$ is sensed at step 425, and a further test of the sensed threshold voltage is made at step 430. If, at step 430, $V_{t-L}$ is less than PV1, R is set to "0" at step 415, while R is set to "1" at step 420 if $V_{t-L}$ is greater than PV2 at step 430. In any case, the method may terminate at step 435.

Figure 7:
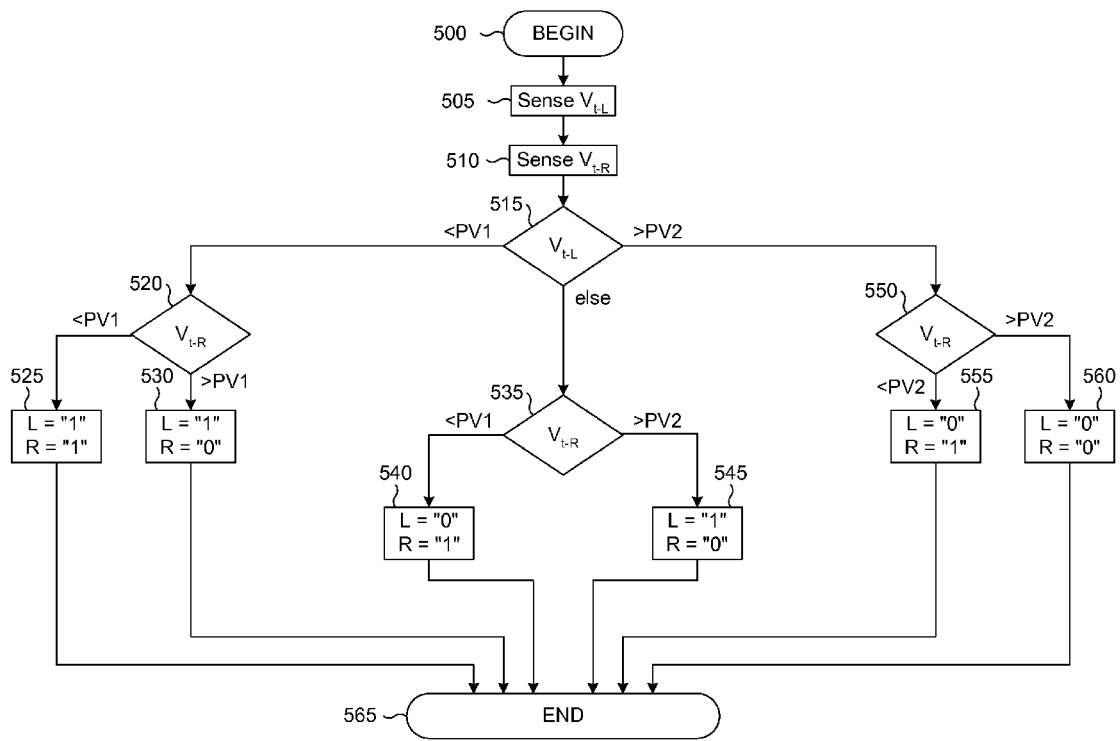
FIG. 7 is a flow diagram of an implementation of a method of reading left and right data regions of a charge-trapping SLC.

Another implementation of a method of reading a memory cell, such as a charge-trapping SLC, according to the present invention is summarized as a flow diagram in FIG. 7. According to this implementation, which may begin at step 500, both $V_{t-L}$ and $V_{t-R}$ are sensed, respectively, at step 505 and step 510 to yield sensed values of $V_{t-L}$ and $V_{t-R}$. At step 515, a three-way test is performed according to the sensed value of $V_{t-L}$. If $V_{t-L}$ is less than PV1, then a two-way test is performed at step 520 regarding the sensed value of $V_{t-R}$. If $V_{t-R}$ is less than PV1, then a decision is made at step 525 that both the left bit L and the right bit R are equal to "1." That the decision at step 525 is consistent with the procedure used to program the memory cell can be seen by reviewing the diagrams in FIGS. 2A, 2B, 3A, 3B, 4C, 4D, 4E, 4F, 5C, 5D, 5E, and 5F. The only figures for which both $V_{t-L}$ and $V_{t-R}$ are less than PV1 are FIGS. 2A and 2B. As indicated on those figures, L="1" and R="1."

If $V_{t-R}$ is greater than PV1 at step 520, then a decision at step 530 declares that L="1" and R="0." This decision agrees with FIGS. 5E and 5F where L="1," R="0" when $V_{t-L}$ is less than PV1 and $V_{t-R}$ is greater than PV1. This decision may also agree with FIGS. 5C and 5D when, for example, the 210 distribution of $V_{t-L}$ results from the programming of the cell. In either case, the decision is seen to be the correct one when the implementation of FIG. 7 is followed.

Returning to step 515, if $V_{t-L}$ is greater than PV2, then a two-way test of the sensed value of $V_{t-R}$ is performed at step 550. If $V_{t-R}$ is greater than PV2, then both L and R are declared to be "0" at step 560 consistent with FIGS. 3A and 3B. If $V_{t-R}$ is less than PV2 at step 550, then a decision is made that L="0" and R="1" at step 555 consistent with FIGS. 4C and 4D. Returning again to step 515, if PV1 is less than $V_{t-L}$ and $V_{t-L}$ is less than PV2, then a test of the sensed value of $V_{t-R}$ is performed at step 535. If $V_{t-R}$ is less than PV1, then L is declared to be "0," and R is declared to be "1" at step 540 consistent with FIGS. 4E and 4F. Otherwise, if $V_{t-R}$ is greater than PV2, then a decision is made that L="1" and R="0" at step 545 consistent with FIGS. 5C and 5D. In any case, the implementation of the method may terminate at step 565.

Figure 8:
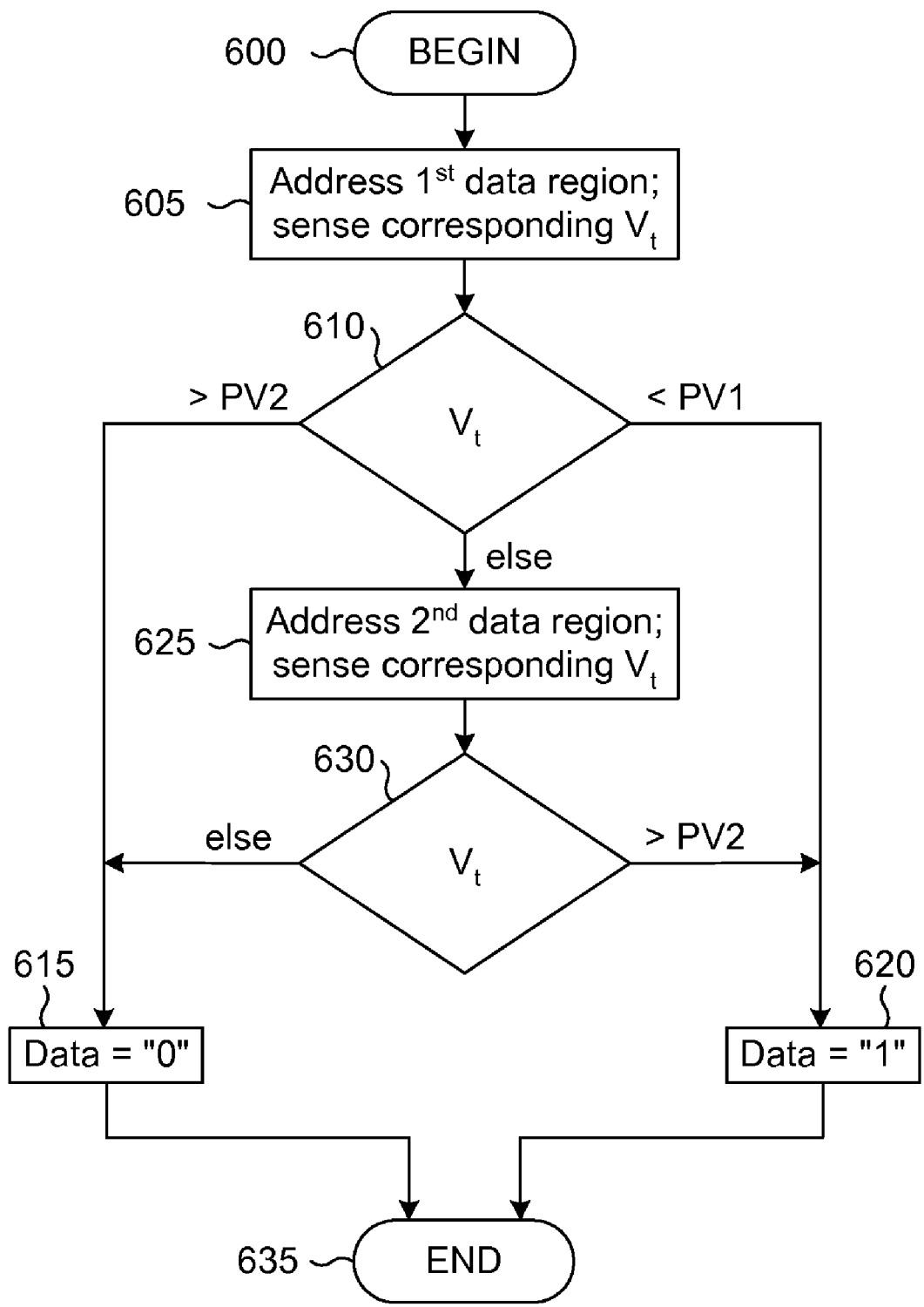
FIG. 8 is a flow diagram of an implementation of a method of reading one data region of a charge-trapping SLC.

An alternative to the implementation described in FIGS. 6A and 6B for reading a data region of a charge-trapping SLC is illustrated in FIG. 8. The illustrated implementation, which may apply to reading either a left or a right data region, may begin at step 600 and may continue at step 605 by addressing a first data region of a charge-trapping SLC and then sensing a $V_t$ associated with the addressed data region. The sensed $V_t$ may be compared at step 610 with PV1 and PV2. If $V_t$ is greater than PV2, then the value of the data associated with the addressed data region may be declared to be "0" at step 615, and the implementation may terminate at step 635. If $V_t$ is less than PV1, then the value of the data associated with the first data region may be declared to be "1" at step 620, and the implementation may terminate at step 635. If $V_t$ is between PV1 and PV2, then the second data region of the charge-trapping SLC may be addressed at step 625, and the $V_t$ associated with the second data region may be sensed. At step 630, if the $V_t$ associated with the second data region is greater than PV2, then the implementation may continue at step 620, declaring the data associated with the first data region to be "1." Otherwise, the data associated with the first data region may be declared to be "0." In either case, the implementation may terminate at step 635.

Figure 9A:
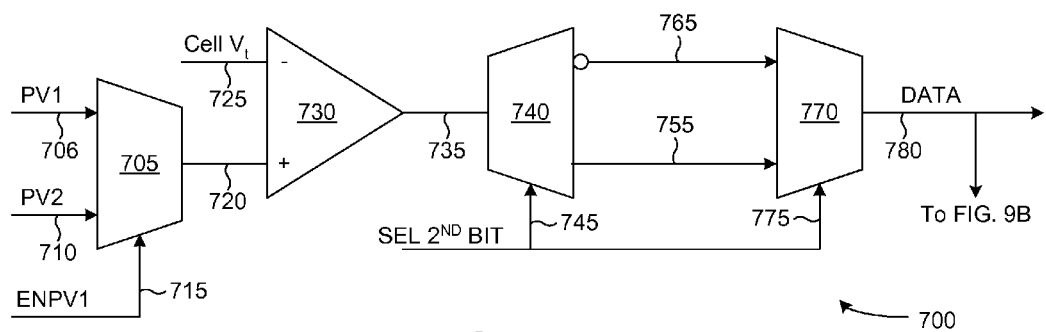
FIG. 9A is a schematic diagram of a first portion of a circuit that may perform functions, such as the reading of a data region of a charge-trapping SLC, of the implementation of FIG. 8.
Figure 9B:
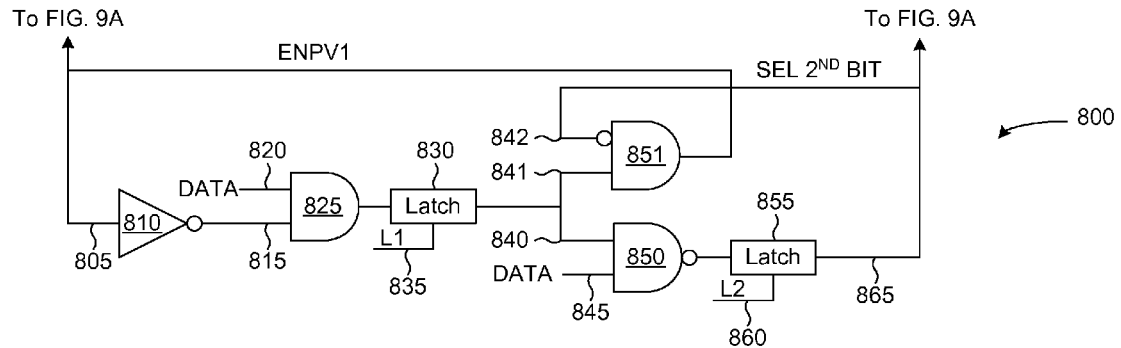
FIG. 9B is a schematic diagram of a second portion of the circuit that may perform functions of the implementation of FIG. 8.

An embodiment of circuits that may perform functions of the implementation of FIG. 8, as one example, is illustrated in FIGS. 9A and 9B. A first portion 700 of the embodiment is illustrated in FIG. 9A and comprises a first multiplexer (MUX1) 705, a second multiplexer (MUX2) 740, a third multiplexer (MUX3) 770 and a comparator 730. An output of MUX1 705 is provided on connection 720 to a non-inverting input of the comparator 730, an output of which couples to an input of MUX2 740 on connection 735. A first output of MUX2 740 connects to a first input of MUX3 770, effectively forming a non-inverting path 755 between MUX2 740 and MUX3 770. An inverted second output of MUX2 740 connects to a second input of MUX3, effectively forming an inverting path 765 between MUX2 740 and MUX3 770.

MUX1 705 receives program level inputs PV1 and PV2 on respective input terminals 706 and 710, one of which is selected as an output of MUX1 according to a selection signal ENPV1 on a first control input 715. That is, when ENPV1 is high, the output of MUX1 is PV1; the output of MUX1 is PV2 when ENPV1 is low. The comparator 730 receives a cell $V_t$ on an inverting input 725, and the comparator 730 output is coupled by the pair of multiplexers MUX2 740 and MUX3 770 to an output terminal 780 as DATA. The DATA signal is an inverted or non-inverted copy of the comparator 730 output on connection 735 according to a condition of a selection signal SEL $2^{ND}$ BIT applied to second and third control inputs 745 and 775. That is, if SEL $2^{ND}$ BIT is low, the output signal from the comparator 730 is coupled to the output 780 by way of non-inverting path 755 with the DATA signal on the MUX3 output 780 being a non-inverted copy of the comparator 730 output signal. Conversely, if SEL $2^{ND}$ BIT is high, then the comparator 730 output passes through the inverting path 765, and the DATA signal is an inverted copy of the comparator 730 output signal.

A second portion 800 of the embodiment is shown in FIG. 9B and comprises an inverter 810 having an input terminal 805. An output of the inverter 810 connects to a first input 815 of a first AND gate 825. An output of the first AND gate 825 feeds into a first latch 830 controlled by a first control signal L1 on a first control terminal 835. An output of the first latch 830 connects to a first input terminal 840 of a NAND gate 850, an output of which feeds into a second latch 855 controlled by a second control signal L2 on a second control terminal 860. The output of the first latch 830 also connects to a first input terminal 841 of a second AND gate 851. The control signal ENPV1 appears on an output of the second AND gate 851 and is fed back to the input terminal 805 of the inverter 810 as well as to the control terminal 715 of MUX1 (FIG. 9A). The control signal SEL $2^{ND}$ BIT appearing on an output of the second latch 855 is fed back to a second (inverting) input of the second AND gate 851 and also is fed to control terminals 745 and 775 (FIG. 9A).

The circuits of FIGS. 9A and 9B may be operated by a controller (not shown) configured to perform such functions as addressing memory cells, coupling cell threshold voltages, program verify levels, and DATA levels to various inputs, controlling the first and second latches 830 and 855, sampling a DATA signal at appropriate sensing times, and the like. According to an exemplary embodiment, the controller performs its functions according to timing diagrams shown in FIGS. 10A, 10B, 10C and 10D and the flow diagrams of FIGS. 6A and 6B.

In typical operation cycles, threshold voltages (i.e., cell $V_t$) associated with first and second regions (first and second regions may be either, respectively, left and right or right and left, and it may be noted that an address of a $1^{st}$ bit may be greater or less than an address of a $2^{nd}$ bit) of a charge-trapping SLC may be presented on an inverting input 725 of the comparator 730, and program verify levels PV1 and PV2 may be presented to respective input terminals 706 and 710 of MUX1 705. The cell $V_t$ may be compared with PV1 or PV2 applied to a non-inverting input 720 of the comparator 730 according to the selection signal ENPV1. The output of the comparator 730 appears on the connection 735, which is input to MUX2 740, and is steered to an output terminal of MUX3 770 through either the non-inverting path input 755 or the inverting path 765 according to the SEL $2^{ND}$ BIT signal applied to selection terminals 745 and 775 of respective second and third multiplexers 740 and 770. That is, the SEL $2^{ND}$ BIT signal is asserted (e.g., set to a high logic level) to cause the cell $V_t$ on the inverting input 725 to be read from the second data region (i.e., the $2^{nd}$ bit) of the SLC and is not asserted (e.g., set to a low logic level) otherwise.

Figure 10A:
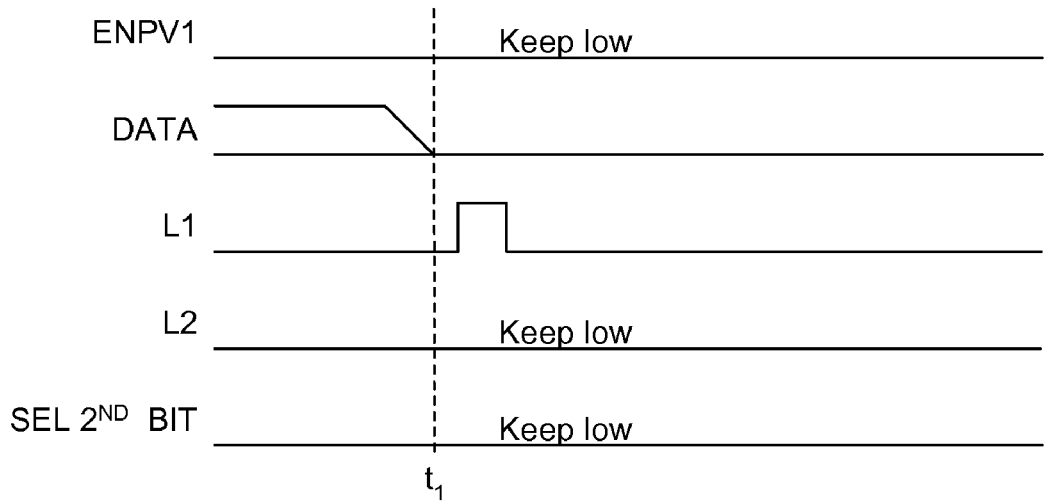
FIGS. 10A-10D are timing diagrams according to aspects of the present invention.

As a first example, with reference to FIGS. 9A, 9B, and 10A, a cell $V_t$ greater than PV2 from a first data region (i.e., a $1^{st}$ bit) may be applied at the inverting input 725. The outputs of latches 830 and 855 (FIG. 9B) may initially be at zero, effectively causing the ENPV1 and SEL $2^{ND}$ BIT control signals to be low. In this condition, the output of MUX1 is PV2, and the output of the comparator 730 is low, the cell $V_t$ being greater than PV2. Accordingly, as SEL $2^{ND}$ BIT is low, the DATA signal on terminal 780 is low. A value of the DATA signal may be observed at a first sensing time $t_1$ according to the timing diagram of FIG. 10A. Note that the controller may decide that DATA="0" without further consideration when the DATA signal is low at the first sensing time $t_1$. Consistent with the result predicted by step 315 of the implementation of FIG. 6A and step 415 of the implementation of FIG. 6B, the DATA value in the present example is "0" or low.

According to a second example, the threshold voltage of the first data region is between PV1 and PV2, and the threshold voltage of the second data region is greater than PV2. In this case, operation of the circuits of FIGS. 9A and 9B may proceed according to the timing diagram of FIG. 10C as follows. With the initial states of latches 830 and 855 at zero, initial values of the ENPV1 and SEL $2^{ND}$ BIT control signals are again low. The signal on the non-inverting input 720 to the comparator 730 is PV2, and the output of the comparator 730 is high, the cell $V_t$ signal on the inverting input 725 being less than PV2. The high result is steered by the SEL $2^{ND}$ BIT selection signal through the non-inverting path 755, causing the DATA signal on the MUX3 770 output 780 to be high. The high value of the DATA signal may be sampled at the first sensing time $t_1$, and the DATA signal may appear as a signal on a second input 820 of the first AND gate 825. The output of the first AND gate 825 becomes high, and the (high) result is latched into the first latch 830 at an instant after $t_1$, causing the output ENPV1 of the second AND gate 851 to become high. ENPV1 then selects the PV1 input signal on MUX1 705, and the output of the comparator 730 becomes low, the cell $V_t$ of the first data region being greater than PV1. The SEL $2^{ND}$ BIT signal being low, the (low) signal on the input 735 of MUX2 is steered through the non-inverting path 755 between MUX2 740 and MUX3 770, causing the DATA signal on MUX3 770 output 780 to be low when sampled at a second sensing time $t_2$. The (low) DATA signal is applied to the second input 845 of the NAND gate 850, the output of which goes high, the high value being latched into the second latch 855 at a instant after second sensing time $t_2$. The latching causes the SEL $2^{ND}$ BIT signal to go high, which (1) causes the cell $V_t$ of the inverting input 725 of the comparator 730 to be read from the second data region and (2) causes the ENPV1 signal to go low due to feedback of the (high) SEL $2^{ND}$ BIT signal to the second (inverting) input of the second AND gate 851, the output of which is ENPV1. The low value of ENPV1 causes MUX1 to select the PV2 input for comparison with the cell $V_t$ of the second data region. The signal on the output 735 of the comparator 730 becomes low because the $2^{nd}$ bit $V_t$ is greater than PV2, and the (low) output of the comparator 730 is steered by the (high) SEL $2^{ND}$ BIT selection signal through the inverting path 765 of the connection between MUX2 740 and MUX3 770, causing the DATA signal on output 780 to be high when sampled at the third sensing time $t_3$, a result consistent with step 320 (FIG. 6A) and step 420 (FIG. 6B) described above.

As a third example, when the threshold voltage of the first data region is between PV1 and PV2 and the cell $V_t$ of the second data region is less than PV2, operation of the circuits of FIGS. 9A and 9B may proceed as follows according to the timing diagram of FIG. 10D. The outputs of latches 830 and 855 (FIG. 9B) may initially be at zero, effectively causing the ENPV1 and SEL $2^{ND}$ BIT control signals to be low as previously described. In this case, PV2 is selected by MUX1 705. When the cell $V_t$ of the first data region is applied to the inverting input terminal 725 of comparator 730, its output 735 becomes high because the cell $V_t$ is less than PV2. The low SEL $2^{ND}$ BIT selection signal steers the high result to the output 780 of MUX3 770, where it may be interpreted as a high DATA signal at a first sensing time $t_1$. The high result is applied as a DATA input to the circuit of FIG. 9B, in particular, to the second input 820 of the first AND gate 825. The controller latches the high result into the first latch 830 by asserting the first control signal L1 at an instant after the first sensing time $t_1$, and the (high) output of the first latch 830 is fed to the first input of the second AND gate 851, causing its output to go high. The high value of ENPV1 causes MUX1 705 to select the PV1 input. The output of the comparator 730 becomes low because the cell $V_t$ is greater than PV1. The (low) output of the comparator 730 is steered by the SEL $2^{ND}$ BIT selection signal through the non-inverting path 755, resulting in a low value for the DATA signal on the output 780 when sampled at a second sensing time $t_2$. The (low) DATA signal may be applied to the second input 845 of the NAND gate 850, causing the output of the NAND gate 850 to go high. The high result may be latched by the second control signal L2 into the second latch 855 at an instant after the second sensing time $t_2$, the output of the second latch 855 becoming a new (high) value for the SEL $2^{ND}$ BIT selection signal. The (high) SEL $2^{ND}$ BIT signal is fed back to the second (inverting) input 842 of the second AND gate 851, causing the output ENPV1 of the second AND gate 851 to change to a low value, thereby selecting the PV2 input of MUX1 705 and causing the signal on the non-inverting input 720 of the comparator 730 to change to PV2. The SEL $2^{ND}$ BIT selection signal, which is now high, causes the cell $V_t$ of the second data region to be applied to the inverting input 725 of the comparator 730, the output of which becomes high because the second cell $V_t$ is less than PV2. The SEL $2^{ND}$ BIT selection signal is also applied to the respective selection terminals 745 and 775 of MUX2 740 and MUX3 770, effectively steering the (high) signal on comparator output connection 735 through the inverting path 765, causing the DATA signal on output 780 to be low at a third sensing time $t_3$. The low value of the DATA signal at sensing time $t_3$ corresponds to a logic level of "0" consistent with respective steps 315 ad 415 in FIGS. 6A and 6B.

Figure 10B:
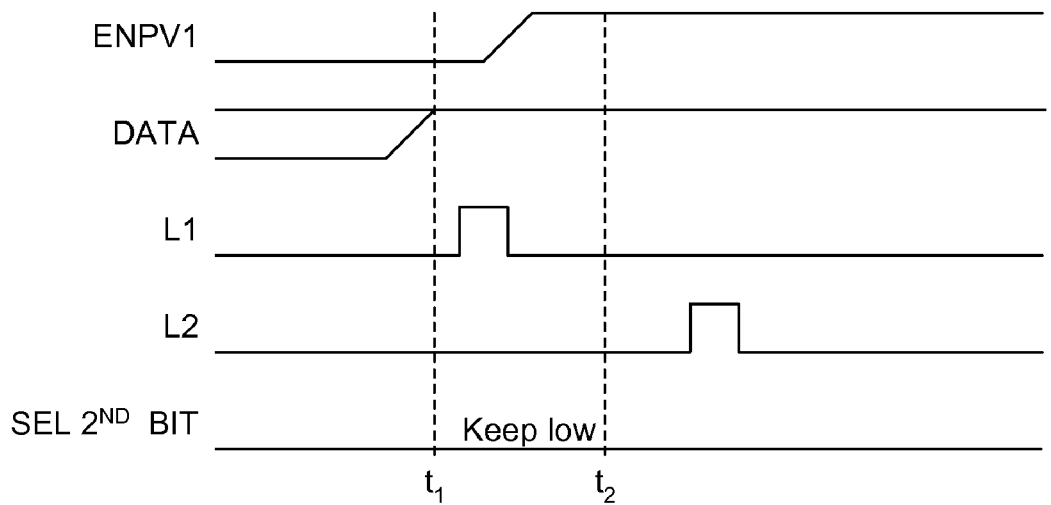
Figure 10C:
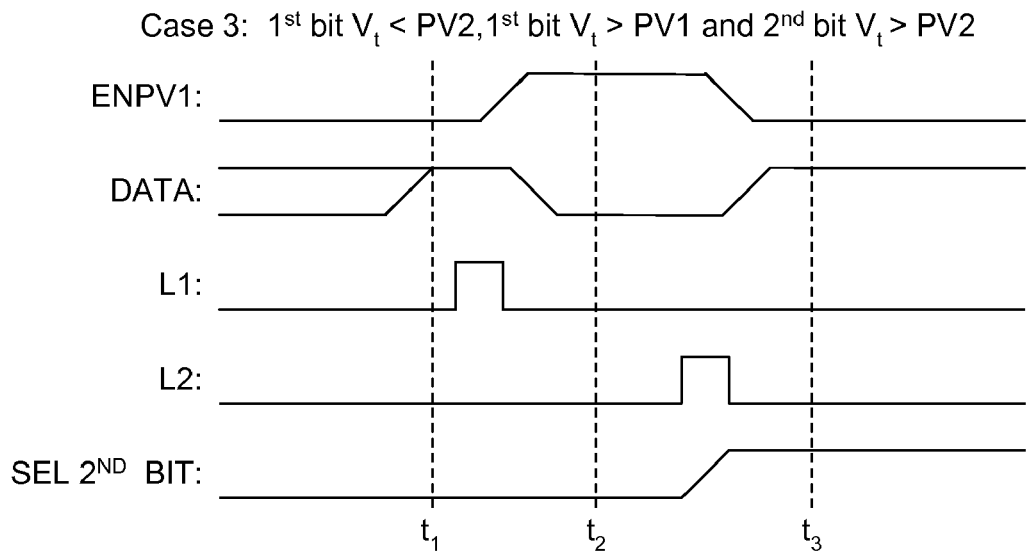
Figure 10D:
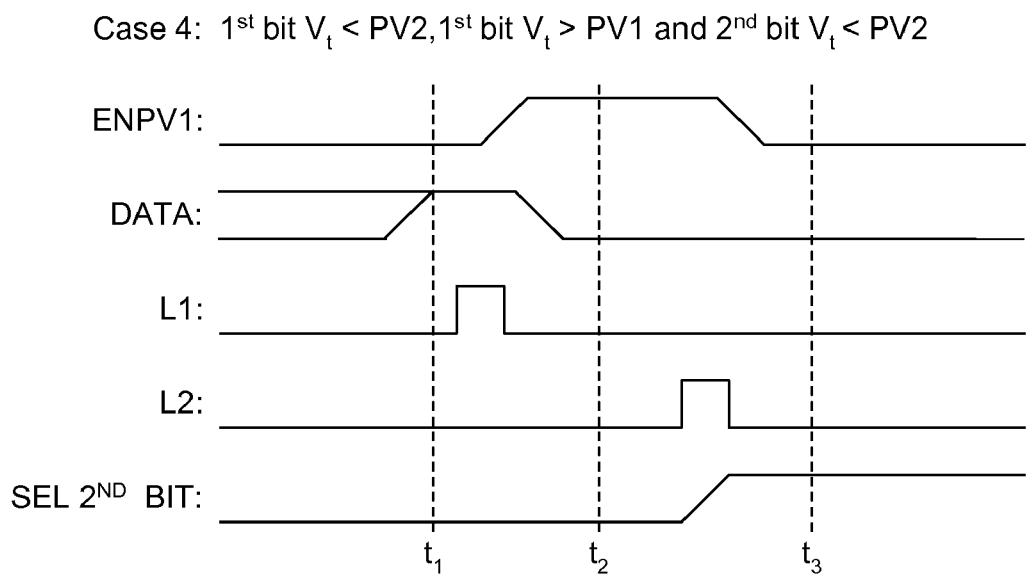

Additional examples corresponding, for example, to the timing diagram of FIG. 10B, and variants of the preceding, may be understood by one skilled in the art in view of this disclosure.

In view of the foregoing, it will be understood by those skilled in the art that the methods of the present invention can facilitate programming and reading of single-level trapped-charge memory devices and, in particular, single-level trapped-charge memory devices having dual bit cell structures and exhibiting the second-bit effect, in an integrated circuit. A gain in an operating window of such devices may result. Implementations of the methods described herein may be readily adapted to scaled-down geometries, and program speed may be improved. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of operating a memory cell having first and second data regions, comprising:
    providing first and second bits of data having values corresponding to distinguishable threshold voltages to be programmed into the first and second data regions;
    changing a threshold voltage of the first and second data regions to a second level, when the first and second bits have a first value; and
    changing the threshold voltage of the first data region to a first level, when the first and second bits have first and second values, respectively.

2. The method as set forth in claim 1, further comprising:
    sensing the threshold voltage of the second data region after the changing of the threshold voltage of the first data region to the first level; and
    changing the threshold voltage of the first region to the second level by soft programming when the sensed threshold voltage of the second data region is greater than the first level.

3. The method as set forth in claim 2, wherein the first level is greater than a threshold voltage of an unprogrammed memory cell and the second level is higher than the first level.

4. The method as set forth in claim 2, wherein the first level is less than a threshold voltage of an unprogrammed memory cell and the second level is lower than the first level.

5. A method of reading a memory cell having first and second data regions, comprising:
    sensing a threshold voltage of the first data region;
    comparing the sensed threshold voltage with first and second threshold levels;
    deciding that the first data region is programmed when the sensed threshold voltage is greater than the second threshold level; and
    deciding that the first data region is unprogrammed when the sensed threshold voltage of the first data region is less than the first threshold level.

6. The method as set forth in claim 5, further comprising:
    sensing a threshold voltage of the second data region when the threshold voltage of the first data region is greater than the first threshold level and less than the second threshold level; and
    deciding that the first data region is programmed when the threshold voltage of the second data region is less than the first threshold level.

7. The method as set forth in claim 6, further comprising deciding that the first data region is unprogrammed when the threshold voltage of the second data region is greater than the second threshold level.

8. A method of reading a charge-trapping memory cell having first and second data regions, comprising:
    sensing a threshold voltage of the first data region;
    sensing a threshold voltage of the second data region;
    deciding that the first and second data regions are unprogrammed when the sensed threshold voltages of the first and second data regions are less than a first level; and
    deciding that the first and second data regions are programmed when the sensed threshold voltages of the first and second data regions are greater than a second level.

9. The method as set forth in claim 8, further comprising deciding that the first data region is programmed and the second data region is unprogrammed when the sensed threshold voltage of the first data region is not less than the first level and not greater than the second level and when the sensed threshold voltage of the second data region is less than the first level.

10. The method as set forth in claim 8, further comprising deciding that the first data region is programmed and the second data region is unprogrammed when the sensed threshold voltage of the first data region is greater than the second level and the sensed threshold voltage of the second data region is less than the second level.

* * * * *